(12) United States Patent
Lai et al.

(10) Patent No.: US 8,913,358 B2
(45) Date of Patent: Dec. 16, 2014

(54) LATCH-UP IMMUNE ESD PROTECTION

(75) Inventors: Da-Wei Lai, Singapore (SG); Mahadeva Iyer Natarajan, Clifton Park, NY (US)

(73) Assignee: GLOBALFOUNDRIES Singapore Pte. Ltd., Singapore (SG)

( * ) Notice: Subject to any disclaimer, the term of this patent is extended or adjusted under 35 U.S.C. 154(b) by 108 days.

(21) Appl. No.: 13/535,314

(22) Filed: Jun. 27, 2012

(65) Prior Publication Data
US 2014/0002934 A1 Jan. 2, 2014

(51) Int. Cl.
*H02H 9/00* (2006.01)
(52) U.S. Cl.
USPC .......................................................... 361/56
(58) Field of Classification Search
USPC .......................................................... 361/56
See application file for complete search history.

(56) References Cited

U.S. PATENT DOCUMENTS

| | | | |
|---|---|---|---|
| 2002/0153571 A1* | 10/2002 | Mergens et al. | 257/358 |
| 2003/0052332 A1* | 3/2003 | Chen | 257/173 |
| 2009/0268359 A1* | 10/2009 | Chatty et al. | 361/56 |

* cited by examiner

*Primary Examiner* — Scott Bauer
(74) *Attorney, Agent, or Firm* — Horizon IP Pte. Ltd.

(57) ABSTRACT

An ESD module is presented. The ESD module includes an ESD circuit and a latch-up (LU) control circuit. The ESD circuit has a pad terminal and a low power source terminal. The LU control circuit includes a first LU terminal coupled to a high power source and an LU output terminal coupled to the ESD circuit. The ESD module has first and second operating modes. In the first operating mode, the LU control circuit is deactivated and the ESD circuit has a first triggering current $I_{t1}$ which is less than 100 mA. In the second operating mode, the LU control circuit is activated and the ESD circuit has a second triggering current $I_{t2}$ which is greater than 100 mA.

20 Claims, 7 Drawing Sheets

US 8,913,358 B2

LATCH-UP IMMUNE ESD PROTECTION

BACKGROUND

Electrostatic discharge (ESD) generated from static electricity is usually characterized by fast transient high voltage discharge. An ESD event can occur in electrical and electronic circuits, such as an integrated circuit (IC). It can create sufficiently high voltage to cause destructive breakdown of devices connected to, for example, the inputs and/or outputs of the integrated circuits.

An approach to protect ICs from ESD is to use a silicon controlled rectifier (SCR). However, conventional SCR circuits are subject to latch up during normal IC operation. Latch up affects the operation of the IC, rendering it defective.

Therefore, it is desirable to have an ESD protection circuit which can be quickly triggered to avoid damaging internal circuits and immune to latch up during normal operation.

SUMMARY

An ESD module is presented. The ESD module includes an ESD circuit and a latch-up (LU) control circuit. The ESD circuit has a pad terminal and a low power source terminal. The LU control circuit includes a first LU terminal coupled to a high power source and an LU output terminal coupled to the ESD circuit. The ESD module has first and second operating modes. In the first operating mode, the LU control circuit is deactivated and the ESD circuit has a first triggering current $I_{t1}$ which is less than 100 mA. In the second operating mode, the LU control circuit is activated and the ESD circuit has a second triggering current $I_{t2}$ which is greater than 100 mA.

In another embodiment, an ESD module is disclosed. The ESD module includes an ESD circuit. The ESD circuit has a pad terminal and a low power source terminal. The ESD module also includes a latch-up (LU) control circuit. The LU control circuit includes a first LU input terminal coupled to a high power source, a second LU input terminal coupled to the low power source and an LU output terminal coupled to the ESD circuit. The ESD module has first and second operating modes. In the first operating mode, the LU control circuit is deactivated and the ESD circuit has a first triggering current $I_{t1}$ which is less than 100 mA. In the second operating mode, the LU control circuit is activated and the ESD circuit has a second triggering current $I_{t2}$ which is greater than 100 mA.

In yet another embodiment, a method of forming a device is presented. The method includes providing a substrate prepared with an ESD module. The ESD module includes an ESD circuit and a LU control circuit. The ESD circuit has a pad terminal and a low power source terminal. The LU control circuit includes a first LU input terminal coupled to a high power source and an LU output terminal coupled to the ESD circuit. The ESD module has first and second operating modes for the ESD module. In the first operating mode, the LU control circuit is deactivated and the ESD circuit has a first triggering current $I_{t1}$ which is less than 100 mA. In the second operating mode, the LU control circuit is activated and the ESD circuit has a second triggering current $I_{t2}$ which is greater than 100 mA.

These and other advantages and features of the embodiments herein disclosed, will become apparent through reference to the following description and the accompanying drawings. Furthermore, it is to be understood that the features of the various embodiments described herein are not mutually exclusive and can exist in various combinations and permutations.

BRIEF DESCRIPTION OF THE DRAWINGS

In the drawings, like reference characters generally refer to the same parts throughout the different views. Also, the drawings are not necessarily to scale, emphasis instead generally being placed upon illustrating the principles of the invention. In the following description, various embodiments of the present invention are described with reference to the following drawings, in which.

DETAILED DESCRIPTION

Embodiments generally relate to semiconductor devices. In one embodiment, the devices include an ESD circuit. The ESD circuit, for example, is activated during an ESD event to dissipate transmission line pulse (TLP) current. The devices, for example, may be any type of semiconductor devices, such as integrated circuits (ICs). The ICs can be incorporated into or used with, for example, electronic products, computers, displays, cell phones, and personal digital assistants (PDAs). The devices may also be incorporated into other types of products.

Figure 1:
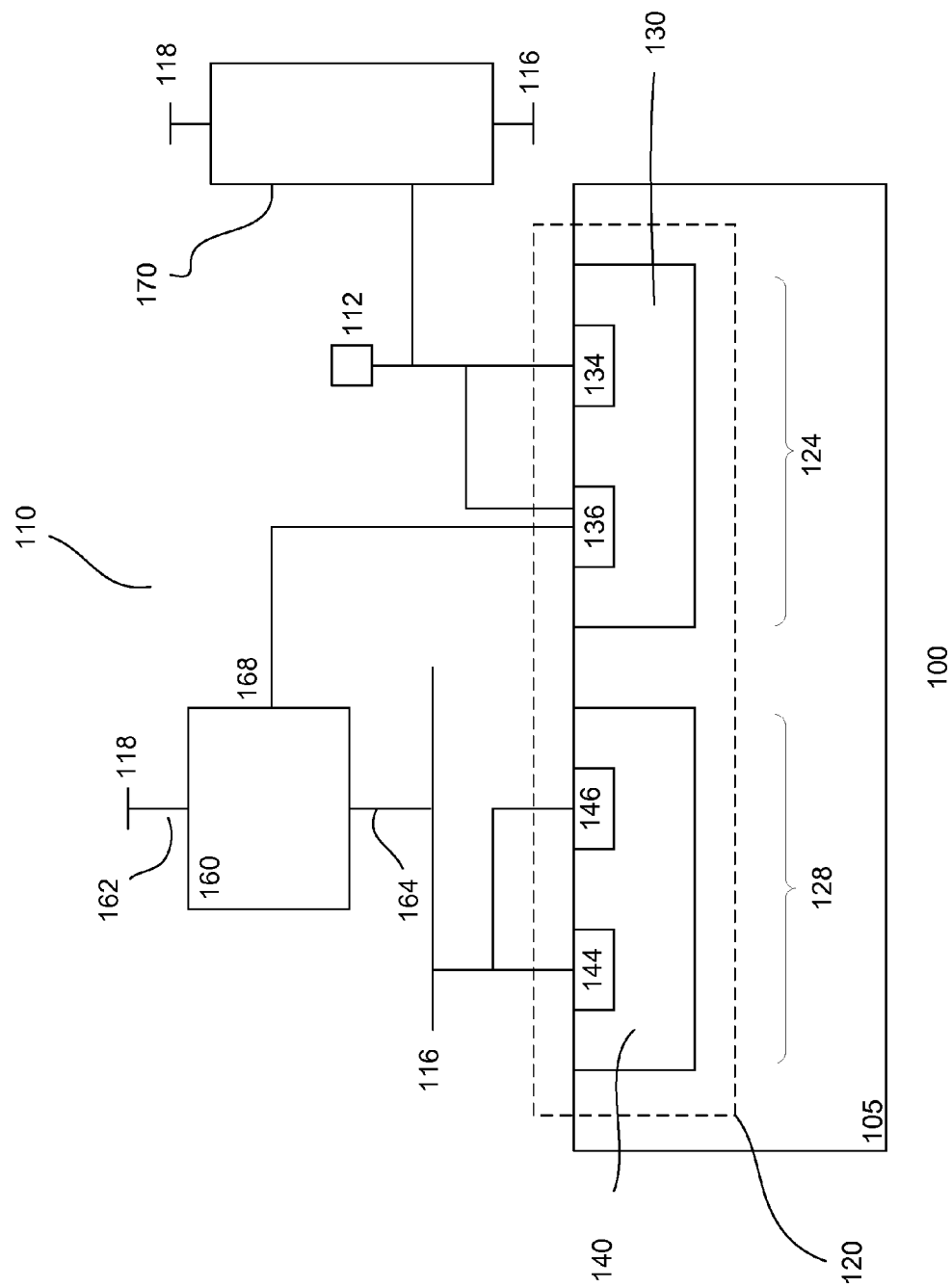
FIG. 1 shows an embodiment of a portion of a device with an ESD module.

FIG. 1 shows an embodiment of a portion of a device 100. The device is formed in a semiconductor substrate 105. The substrate, in one embodiment, is a silicon substrate. Other types of semiconductor substrates, including semiconductor-on-insulator substrates, may also be useful. The substrate, in one embodiment, is a lightly doped p-type silicon substrate. For example, the lightly doped p-type substrate has a dopant concentration of about $1.7 \text{ e}15 \text{ cm}^{-3}$. Other doping concentrations may also be useful. In other embodiments, the substrate may be doped with n-type dopants and/or other dopant concentrations. P-type dopants, for example, include boron (B), aluminum (Al), indium (In) or a combination thereof, while n-type dopants can include phosphorus (P), arsenic (As), antimony (Sb) or a combination thereof.

The device includes an ESD module 110. The ESD module, in one embodiment, includes an ESD circuit 120 and a latch-up (LU) control circuit 160. As shown, the ESD circuit is disposed in the substrate. The ESD circuit may include an ESD isolation region (not shown) to isolate the ESD circuit. The ESD isolation region, for example, may surround the ESD circuit. The ESD isolation region may be a trench isolation region. The ESD isolation region, for example, is a shallow trench isolation (STI) region. The ESD isolation region may be the same as those used to isolate active regions of the device. Other types or configurations of isolation regions may also be useful. In other embodiments, no ESD isolation region is provided.

The ESD circuit, in one embodiment, is a silicon-controlled rectifier (SCR) ESD circuit. The ESD circuit includes a first portion (FP) 124 and a second portion (SP) 128. The portions serve as terminals of the ESD circuit. For example, first and second terminals 112 and 116 are coupled to the FP and SP. In one embodiment, the first terminal is coupled to a pad. The pad, for example, is an I/O pad of the device. As for the second terminal, it is coupled to a low power source. The low power source, for example, is ground or $V_{SS}$. Other types of configurations of couplings for the terminals may also be useful.

An internal circuit 170 is coupled to the pad. The internal circuit, for example, is an I/O circuit, such as an inverter. Other types of internal circuits may also be coupled to the pad. The internal circuit is coupled between the high and low power sources 118 and 116. The high power source, for example, may be $V_{DD}$ and the low power source may be $V_{SS}$. Other types of high and low power sources may also be useful.

In one embodiment, the FP includes a FP well 130. The FP well is doped with second polarity type dopants. As for SP, it includes a SP well 140. The SP well is doped with first polarity type dopants. The first polarity, in one embodiment, is p-type and the second polarity type is n-type. Other configurations of polarity types may also be useful. In some embodiments, one of the wells may be provided by the substrate. In the case where the substrate is appropriately doped, it may serve as a well for one of the ESD portions. For example, if the substrate is appropriately doped with first polarity type dopants, it can serve as the SP well. Other configurations of wells may also be useful.

The FP and SP may be separated by an intermediate isolation region (not shown). The intermediate isolation region, for example, may be a part of the ESD isolation region. Other configurations of isolation regions may also be useful.

The FP includes first and second FP contact regions 134 and 136. The first FP contact region is a first polarity type contact region and the second FP contact region is a second polarity type contact region. The first and second FP contact regions serve as contact regions for the first terminal. For example, the first and second FP contact regions are commonly coupled to the pad. In one embodiment, an FP isolation region (not shown) may be provided to separate the FP contact regions. In other embodiments, no FP isolation region is provided to separate the FP contact regions. For example, the FP contact regions are butt contact regions.

As for the SP, it includes first and second SP contact regions 144 and 146. The first SP contact region is a first polarity type contact region and the second SP contact region is a second polarity type contact region. The first and second SP contact regions serve as contact regions for the second terminal. For example, the first and second SP contact regions are coupled to the low power source, such as $V_{SS}$. An SP isolation region (not shown) may be provided to separate the first and second SP contact regions. In other embodiments, no SP isolation region is provided to separate the first and second SP contact regions. For example, the first and second SP contact regions are butt contact regions.

The contact regions, in one embodiment, are heavily doped regions. Providing contact regions of other dopant concentrations may also be useful. Furthermore, metal silicide contacts may be provided on the surface of the contact regions. The silicide contacts, for example, reduce contact resistance.

As shown, the first and second contact regions of FP and SP are disposed such that the second contact regions are adjacent to each other. It is understood that other configurations of the first and second contact regions may also be useful. For example, the first contact regions may be adjacent to each other or a first contact region of one portion and a second contact region of the other portion are adjacent to each other.

The ESD circuit, under ESD conditions, creates a current path from the pad to ground to dissipate ESD current. For example, when sufficient ESD current passes through the ESD circuit, it is activated or triggered to create the current path. The value of current at which the ESD circuit is activated is referred to as the triggering current $I_t$.

In one embodiment, a latch-up (LU) control circuit 160 is provided. The LU control circuit, as shown, includes first and second LU control input terminals 162 and 164 and a LU control output terminal 168. The first LU control input terminal is coupled to a high power source 118 and the second LU control input terminal is coupled to a low power source 116. For example, the high power source is $V_{DD}$ and the low power source is $V_{SS}$. Providing other high and/or low power sources may also be useful. The control output terminal, in one embodiment, is coupled to the second FP contact region.

The ESD module has first and second operating mode. One of the operating modes is the ESD mode and the other is the LU mode. For example, the first mode is an ESD mode; the second mode is a latch-up (LU) mode. The LU control circuit is deactivated in the ESD mode and activated in the LU mode. In the LU mode, the power supply (e.g., $V_{DD}$) is on or supplied to the device. As such, the device is operating under normal conditions, but with higher positive or negative DC voltage to force current to the pad. As for the ESD mode, the power supply is floated.

In one embodiment, the ESD circuit has a first triggering current $I_{t1}$ in the first operating mode and a second triggering current $I_{t2}$ in the second operating mode. The ESD circuit, for example, has $I_{t1}$ in the ESD mode and $I_{t2}$ in the LU mode. In one embodiment, $I_{t1}$ is <$I_{t2}$. In one embodiment, $I_{t1}$ is less than a triggering current threshold $I_{tt}$ and $I_{t2}$ is greater than $I_{tt}$. The triggering current threshold $I_{tt}$ is 100 mA. According to JEDEC, latch up is prevented from occurring if $I_t$ is greater than 100 mA. Preferably, $I_{t1}$ is sufficiently low to enable quick triggering of the ESD circuit to prevent damage to the internal circuit.

Figure 2:
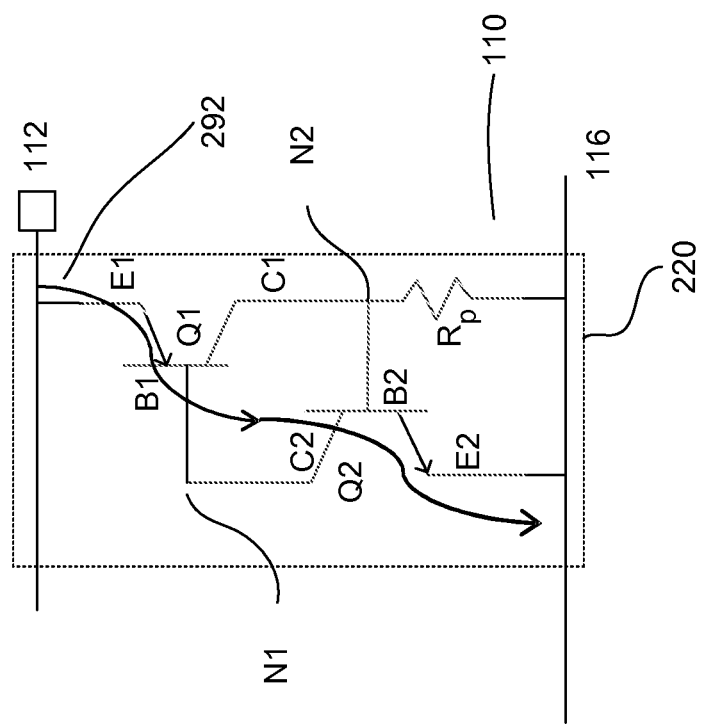
FIG. 2 shows an embodiment an ESD module with a parasitic circuit.

The ESD circuit produces a parasitic circuit. FIG. 2 shows a parasitic circuit 220 of the ESD circuit 120 of FIG. 1. Referring to FIGS. 1-2, the parasitic circuit includes first and second bipolar junction transistors (BJT) Q1 and Q2 between the pad 112 and the low power source 116. In one embodiment, Q1 is a pnp transistor and Q2 is a npn transistor.

The first transistor Q1 includes a first emitter terminal E1, a first base terminal B1 and a first collector terminal C1. Similarly, Q2 includes a second emitter terminal E2, a second base terminal B2 and a second collector terminal C2. In one embodiment, Q1 is a pnp transistor while Q2 is an npn transistor.

In one embodiment, E1 is formed by the first FP contact region. For example, E1 is the heavily doped p-type first FP contact region. The p-type substrate forms C1 while B1 is formed by the n-doped FP well. This produces a first vertical pnp transistor. For example, the vertical pnp transistor is formed along a direction perpendicular to a surface of the substrate. The pad is coupled to E1 while C1 is coupled to the low power source by a second resistor $R_p$ formed by the p-doped SP well. The connection of C1 and $R_p$ forms a second node N2. As for the base of Q1, it is coupled to the second FP contact region and output terminal of the control circuit. The connection between B1 and the second FP contact region forms a first node N1.

As shown, Q2 is coupled between N1 and the low power source. For example, C2 is coupled to N1 and E2 is coupled to the low power source. The base of Q2 is coupled to N2. For example, Q2 is coupled to C1 and the low power source at N2. This forms a second lateral npn transistor. For example, the second lateral transistor is parallel to the substrate surface. The second collector C2 is formed by n-doped FP well, B2 is formed by the p-doped SP well, while E2 is formed by the n-doped second SP contact region. When the ESD circuit is triggered, a current path 292 is created between the pad and the low power source, such as $V_{SS}$. As shown, the current path between pad and $V_{SS}$ through E1, B1, C2, B2 and E2. This current path is referred to as the LU current path of the ESD circuit. When a sufficient substrate current, such as $I_t$, conducts through B1 and C1, the ESD circuit is triggered to create the LU current path. In one embodiment, $I_t$ is equal to $I_{t1}$ in the ESD mode.

Figure 3:
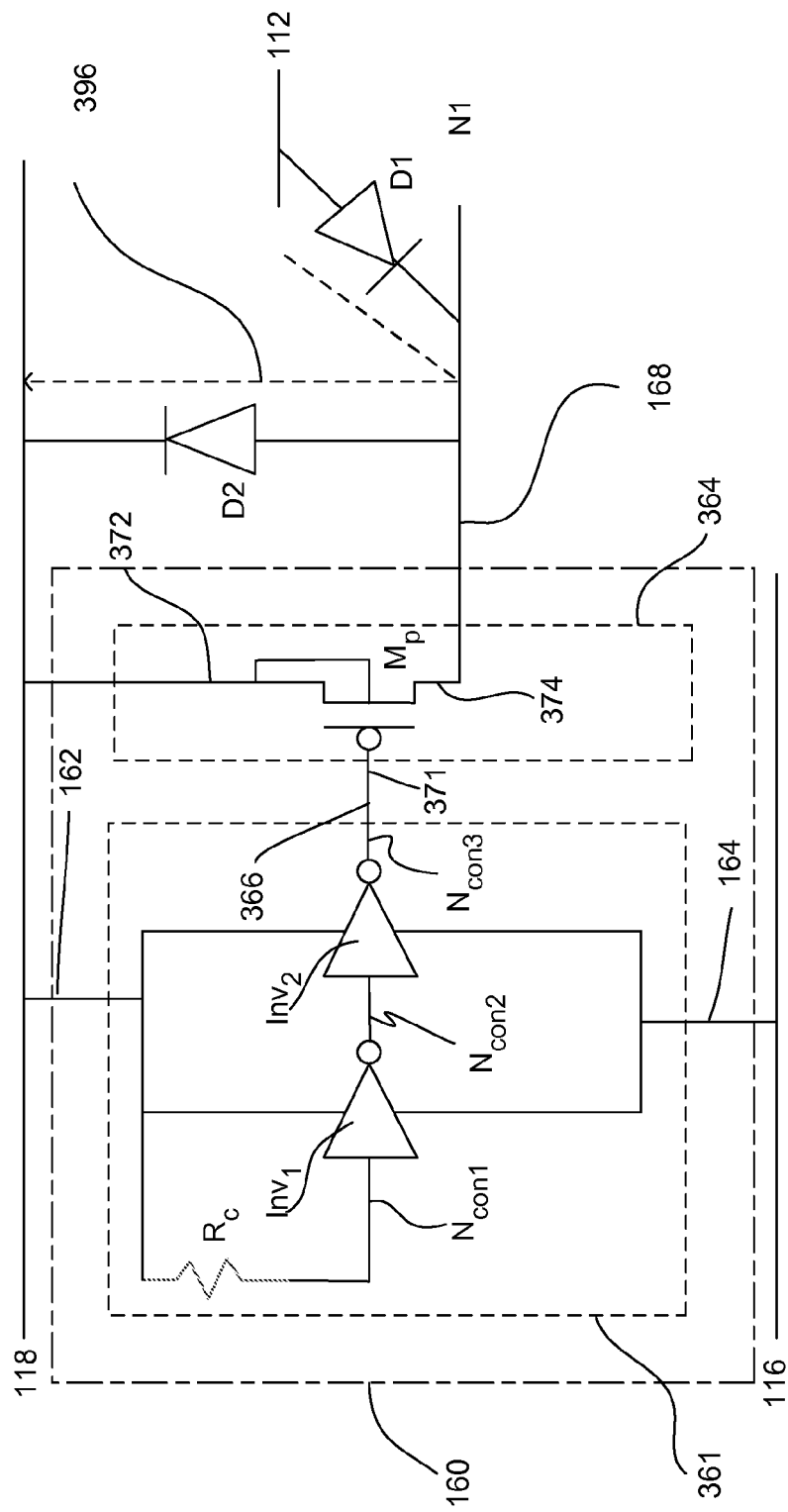
FIG. 3 shows an embodiment of a latch-up (LU) control circuit.

FIG. 3 shows an embodiment of a LU control circuit 160. The LU control circuit may include common elements as that described in FIG. 1. As such, common elements may not be described or described in detail. The LU control circuit includes LU control input (LU) and output ($LU_o$) portions 361 and 364. The $LU_i$ portion has a $LU_i$ output terminal 366 and is coupled to the input terminals 162 and 164 of the LU control circuit. The $LU_o$ portion includes a $LU_o$ input terminal 371 and first and second $LU_o$ terminals 372 and 374. The $LU_o$ input terminal is coupled to the $LU_i$ output terminal while the first $LU_o$ terminal is coupled to the high power source and the second $LU_o$ terminal serves as the LU control output terminal 168 which is coupled to the ESD circuit. For example, the LU control output terminal is coupled to N1 of the ESD circuit.

In one embodiment, when no power is supplied to the device, the $LU_i$ portion generates an inactive $LU_i$ output signal at the $LU_i$ output terminal. On the other hand, when power is supplied to the device, the $LU_i$ portion generates an active $LU_i$ output signal at the $LU_i$ output terminal. For example, when $V_{DD}=0$ V, the $LU_i$ generates an inactive $LU_i$ output signal and when $V_{DD}=V_{DD}$, the $LU_i$ generates an active $LU_i$ output signal. In one embodiment, the inactive $LU_i$ output signal deactivates the $LU_o$ portion, causing the ESD module to operate in the ESD mode; the active $LU_i$ output signal activates the $LU_o$ portion, causing the ESD module to operate in the LU mode.

When the $LU_o$ portion is activated, a second LU current path 396 is created. The second LU current path is from the pad to the high power source by N1. When the $LU_o$ is inactive, no second LU current path is created. For example, in the LU mode, the second current path is created while no current path is created in the ESD mode.

In one embodiment, the second current path includes a first parasitic diode D1 between the pad and N1 and a second parasitic diode D2 from N1 to the high power source. The diodes are coupled in series, with the first anode of D1 coupled the pad, the first cathode of D1 coupled to N1, the second anode of D2 coupled to N1 and the second cathode of D2 coupled to the high power source.

In one embodiment, the $LU_o$ portion includes a $LU_o$ transistor. The $LU_o$ transistor, in one embodiment, is a p-type metal oxide semiconductor field effect transistor (pFET). The $LU_o$ transistor includes first and second S/D terminals and a gate terminal. The S/D terminals are p-type doped regions. A body of the transistor, formed by an n-type transistor well, is coupled to the first S/D terminal.

The active $LU_i$ signal, in one embodiment, is a logic 1 signal and the inactive $LU_i$ signal is a logic 0 signal. Other configurations of active and inactive $LU_i$ signals may also be useful. The active $LU_i$ signal, in one embodiment, switches the $LU_o$ transistor off. This results in the formation of the second current path which includes D1 and D2. The first diode D1 is formed by the FP contact region and the FP well while D2 is formed by the transistor well and first S/D terminal of the $LU_o$ transistor. The inactive $LU_i$ signal switches the $LU_o$ transistor on, creating a path between the first and second S/D terminals. This enables the ESD circuit to operate in the ESD mode.

In one embodiment, the $LU_i$ portion includes first and second inverters $Inv_1$ and $Inv_2$ coupled in series. A resistor Rc is coupled to the first inverter input terminal of $Inv_1$. In one embodiment, the resistor Rc is a poly resistor. The resistor, for example, may be an unsilicided resistor. It can prevent gate oxide breakdown of the inverter if there is high current on $V_{DD}$. A first inverter output terminal of $Inv_1$ is coupled to a second inverter input terminal of $Inv_2$. A second inverter output terminal serves as the $LU_i$ output terminal coupled to the $LU_o$ input terminal. When power is supplied to the device, node $N_{con1}$ is equal to logic 1, $N_{con2}$ is equal to logic 0 and $N_{con3}$ is equal to logic 1. This produces the active $LU_i$ output signal, causing the $LU_o$ portion to be active to create the second current path. When power is not supplied to the device, $V_{DD}$ is floated (zero potential). As such, $N_{con1}$ is equal to logic 0, $N_{con2}$ is equal to logic 1 and $N_{con3}$ is equal to logic 0. This produces the inactive $LU_i$ output signal, causing the $LU_o$ portion to be inactive.

By providing the second current path in the LU mode, the current (e.g., $I_{t2}$) required to trigger the ESD circuit is divided by 2. Under this condition, a higher current is required to sustain the necessary substrate potential to activate the ESD circuit. In one embodiment, $I_{t2}$ is greater than the threshold, preventing latch up in the LU mode. On the other hand, the triggering current (e.g., $I_{t1}$) is less than the threshold, enabling quick triggering of the ESD circuit in the ESD mode to prevent damage to the internal circuit.

Figure 4A:
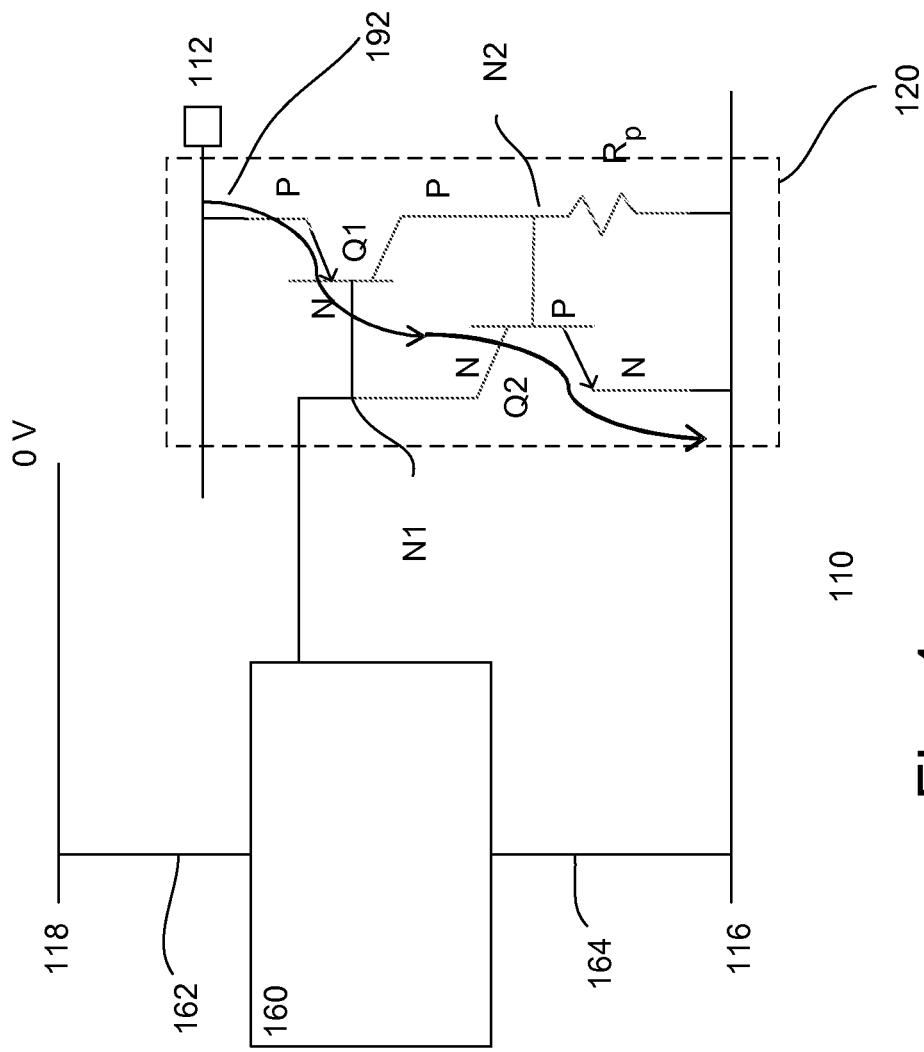
FIGS. 4a-b show an embodiment of an ESD module in the ESD and LU modes.
Figure 4B:
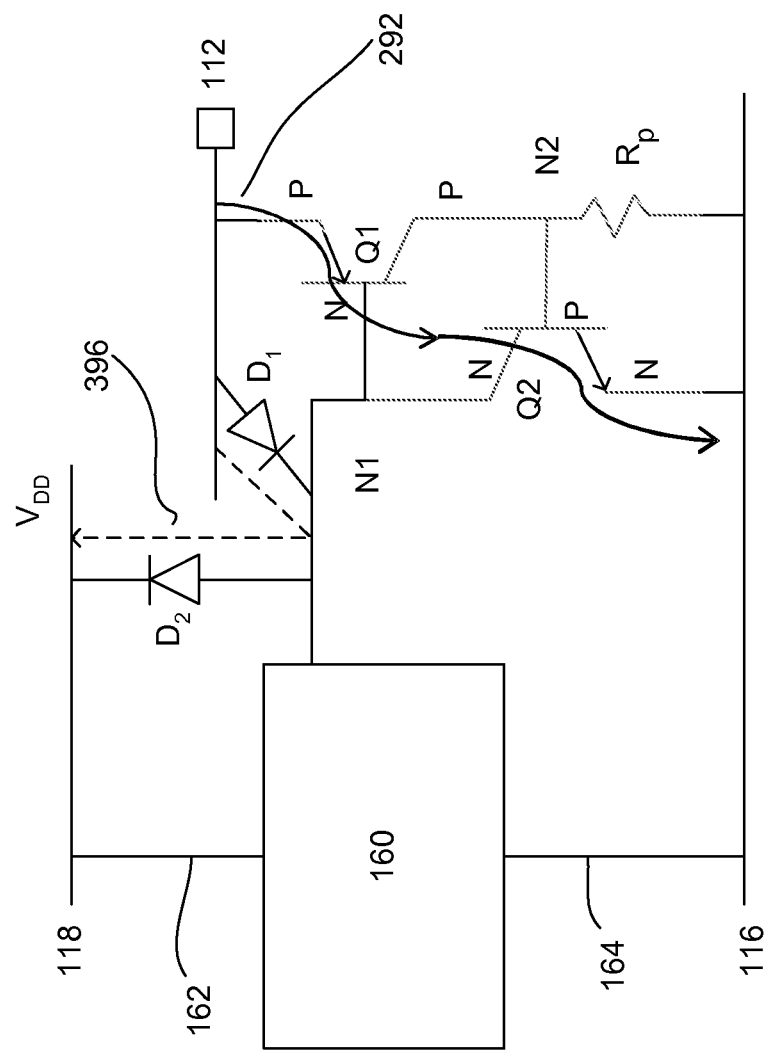

FIGS. 4a-b show embodiments of an ESD module operating in the ESD and LU modes. The ESD module includes a LU control circuit 160 coupled to an ESD circuit 120. The ESD module may include common elements as that described in FIGS. 1-3. For example, the LU control circuit and ESD circuit are similar to that described in FIGS. 1-3. As such, common elements may not be described or described in detail.

Referring to FIGS. 4a-b, the ESD circuit forms first and second parasitic transistors Q1 and Q2. The first transistor Q1 is a pnp transistor and Q2 is an npn transistor. As for the LU control circuit, first and second LU terminals 162 and 164 are coupled to the high power source 118 and low power source 116. The high power source, for example, is $V_{DD}$ and the low power source may be $V_{SS}$. The LU output terminal is coupled to N1 of the ESD circuit.

Referring to FIG. 4a, when $V_{DD}$ is not supplied to the device or IC, the high power source is floated or at zero potential. As such, the LU control circuit is deactivated, causing the ESD circuit to operate in the ESD mode. Under ESD condition, e.g., an ESD zap at the pad, current conducts through Q1 to ground via the substrate $R_p$. When a sufficient current conducts through $R_p$, Q2 is switched on, creating the LU current path 192 in the ESD circuit. For example, when current flowing through $R_p$ reaches $I_{t1}$, the LU current path is created.

Figure 5A:
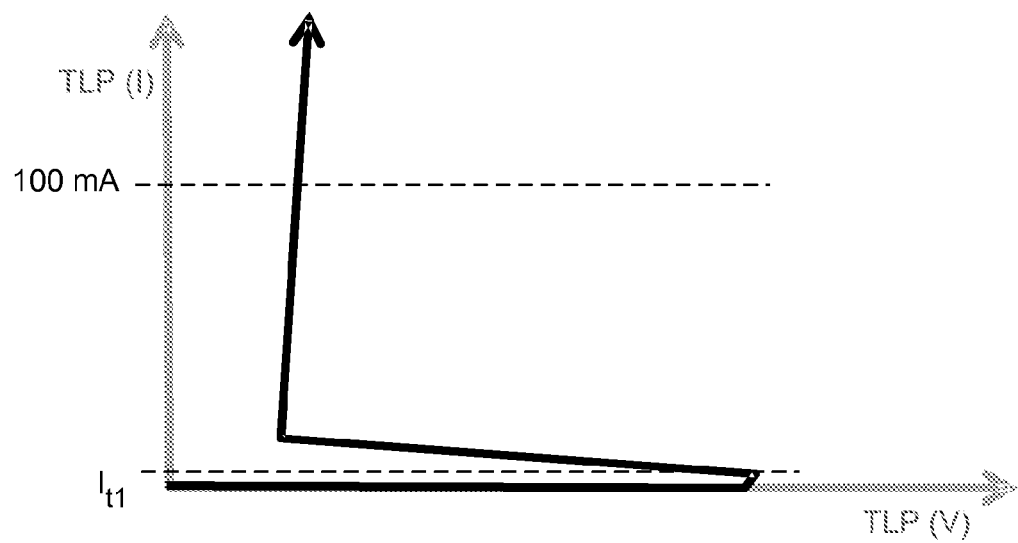
FIGS. 5a-b shows IV curves of an embodiment of an ESD module in the ESD mode and LU mode.

FIG. 5a shows the I-V curve of the ESD module in the ESD mode. The triggering current $I_{t1}$ is much less than 100 mA. This enables quick triggering of the ESD circuit to create the LU current path to prevent damage to the internal circuit it is protecting.

Figure 5B:
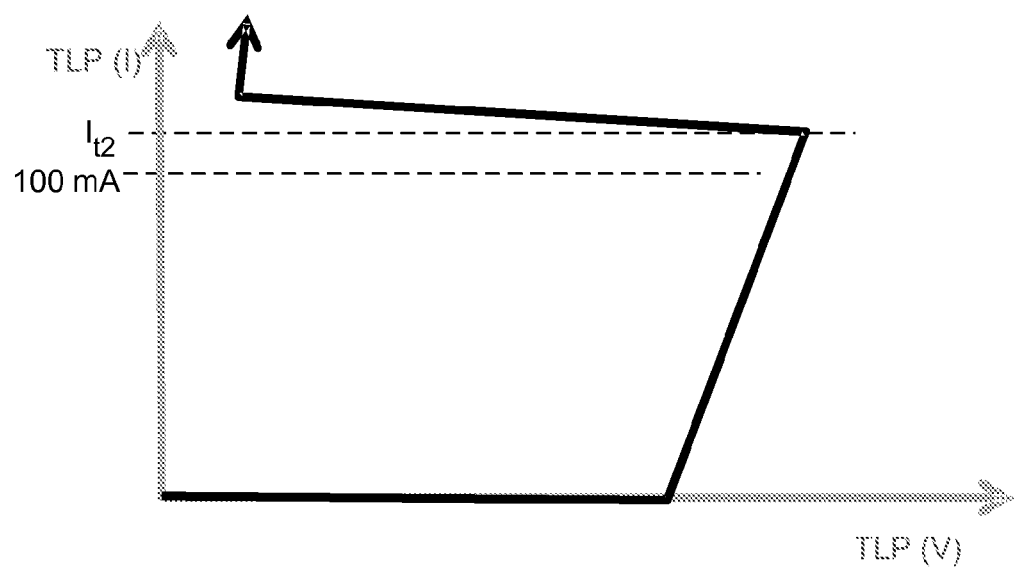

Referring to FIG. 4b, when power is supplied to the device, the high power source is equal to $V_{DD}$. As such, the LU control circuit is activated, causing the ESD circuit to operate in the LU mode. In the LU mode, the ESD circuit has a second current path 396 along with the LU current path 292. The second current path is from the pad to N1 to the high power source. The second current path is formed by first and second parasitic diodes $D_1$ and $D_2$. Due to the ESD circuit having two current paths, the triggering current $I_{t2}$ in the LU mode is greater than 100 mA, as shown in FIG. 5b. This prevents latch-up from occurring in the ESD circuit in the LU mode.

The invention may be embodied in other specific forms without departing from the spirit or essential characteristics thereof. The foregoing embodiments, therefore, are to be considered in all respects illustrative rather than limiting the invention described herein. Scope of the invention is thus indicated by the appended claims, rather than by the foregoing description, and all changes that come within the meaning and range of equivalency of the claims are intended to be embraced therein.

What is claimed is:

1. An ESD module comprising:
    an ESD circuit, the ESD circuit having a pad terminal a low power source terminal;
    a latch-up (LU) control circuit, the LU control circuit includes a first LU input terminal coupled to a high power source and an LU output terminal coupled to the ESD circuit; and
    first and second operating modes for the ESD module, wherein
        in the first operating mode, the LU control circuit is deactivated and the ESD circuit has a first triggering current $I_{t1}$ which is less than 100 mA, and
        in the second operating mode, the LU control circuit is activated and the ESD circuit has a second triggering current $I_{t2}$ which is greater than 100 mA to prevent latch up; and
    wherein the LU control circuit includes
        an LU control input portion having first and second inverters coupled in series, the second inverter output serving as an output terminal of the LU control input portion,
        an LU control output portion having a transistor with a first terminal coupled to the high power source, a second terminal coupled to the LU output terminal and a gate to terminal coupled to the output terminal of the LU control input portion, and
        in the second operating mode, a second operating mode current path is created between the pad terminal, the LU output terminal and the high power source.

2. The ESD module in claim 1 wherein the second operating mode current path includes a first parasitic diode between the pad terminal and the LU output terminal and a second parasitic diode between the LU output terminal and the high power source.

3. The ESI module in claim 2 wherein the ESD circuit comprises a first portion (FP) and a second portion (SP), wherein the FP comprises a FP well doped with second polarity type dopants and the SP comprises a SP well doped with first polarity type dopants.

4. The ESD module in claim 3 wherein the FP comprises a first FP contact region doped with first type polarity dopants and a second FP contact region doped with second type polarity dopants, the first and second FP contact regions are commonly coupled to the pad terminal.

5. The ESD module in claim 4 wherein the SP comprises a first SP contact region doped with first type polarity dopants and a second SP contact region doped with second type polarity dopants, the first and second SP contact regions are commonly coupled to the low power source.

6. The ESD module in claim 5 wherein the second FP contact region and the second SP contact region are adjacent to each other.

7. The ESD module in claim 6 wherein the contact regions are heavily doped.

8. The ESD module in claim 7 wherein the ESD circuit creates a current path from the pad terminal to the low power source terminal to dissipate ESD current under ESD conditions.

9. The ESD module in claim 1 wherein the ESD circuit comprises a silicon control rectifier based (SCR) ESD circuit.

10. The ESD module in claim 1 wherein the LU control circuit comprises a second LU input terminal coupled to the low power source.

11. The ESD module in claim 1 wherein the ESD circuit comprises first and second bipolar junction transistors (BJTs), wherein the first BJT is a pnp transistor and the second BJT is an npn transistor.

12. The ESD module in claim 11 wherein the first BJT comprises:
    a first emitter coupled to the pad terminal;
    a first base coupled to the LU output terminal; and
    a first collector coupled to the low power source.

13. The ESD module in claim 12 wherein the first emitter is formed by the first FP contact region, the first base is formed by the FP well, and the first collector is formed by the substrate, the first base and the second FP contact region are connected to form a first node, and the first collector and a resistor formed by the SP well are connected to form a second node.

14. The ESD module in claim 13 wherein the second BJT comprises:
    a second emitter directly coupled to the low power source;
    a second base coupled to the second node; and
    a second collector coupled to the first node.

15. The ESD module in claim 14 wherein the second emitter is formed by the second SP contact region, the second base is formed by the SP well, and the second collector is formed by the FP well.

16. An ESD module comprising:
    an ESD circuit, the ESD circuit having a pad terminal and a low power source terminal;
    a latch-up (LU) control circuit, the LU control circuit includes a first LU input terminal coupled to a high power source, a second LU input terminal coupled to the low power source and an LU output terminal coupled to the LSD circuit; and
    first and second operating modes for the ESD module, wherein
        in the first operating mode, the LU control circuit is deactivated and the ESD circuit has a first triggering current $I_{t1}$ which is less than 100 mA, and
        in the second operating mode, the LU control circuit is activated and the ESD circuit has a second triggering current $I_{t2}$ which is greater than 100 mA to prevent latch up and wherein the LU control circuit includes an LU control input portion having first and second inverters coupled in series, the second inverter output serving as an output terminal of the LU control input portion,
        an LU control output portion having a transistor first terminal coupled to the high power source, a second terminal coupled to the LU output terminal and a gate terminal coupled to the output terminal of the LU control input portion, and
        in the second operating mode, a second operating mode current path is created between the Dad terminal, the LU output terminal and the high power source.

17. The ESD module in claim 16 wherein the ESD circuit comprises a first portion (FP) and a second portion (SP), wherein the FP comprises a FP well doped with second polarity type dopants and the SP comprises a SP well doped with first polarity type dopants.

18. The ESD module in claim 17 wherein the FP comprises a first FP contact region doped with first type polarity dopants and a second FP contact region doped with second type polarity dopants, the first and second FP contact regions are commonly coupled to the pad terminal.

19. The ESD module in claim 16 wherein second operating mode current path includes a first parasitic diode between the pad terminal and the LU output terminal and a second parasitic diode between the LU output terminal and the high power source.

20. A method of forming a device comprising:
  providing a substrate prepared with an ESD module, wherein the ESD module comprises
    an ESD circuit, the ESD circuit having a pad terminal and a low power source terminal,
    a latch-up (LU) control circuit, the LU control circuit includes a first LU input terminal coupled to a high power source, a second LU input terminal coupled to the low power source and an LU output terminal coupled to the ESD circuit; and wherein the LU control circuit includes an LU control input portion having first and second inverters coupled in series, the second inverter output serving as an output terminal of the LU control input portion,
  and an LU control output portion having a transistor with a first terminal coupled to the high power source, a second terminal coupled to the LU output terminal and a gate terminal coupled to the output terminal of the LU control input portion, and a body coupled to the first terminal, and
  first and second operating modes fir the ESD module, wherein
    in the first operating mode, the LU control circuit is deactivated and the ESD circuit has a first triggering current $I_{t1}$ which is less than 100 mA, and
    in the second operating mode, the LU control circuit is activated and the ESD circuit has a second triggering current $I_{t2}$ which is greater than 100 mA to prevent latch up, wherein a second operating mode current path is created between the pad terminal, the LU output terminal and the high power source.

* * * * *